(12) United States Patent
Chang

(10) Patent No.: US 8,422,283 B2
(45) Date of Patent: Apr. 16, 2013

(54) PHASE CHANGE MEMORY DEVICE TO PREVENT THERMAL CROSS-TALK AND METHOD FOR MANUFACTURING THE SAME

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 10 days.

(21) Appl. No.: 13/241,890

(22) Filed: Sep. 23, 2011

(65) Prior Publication Data

US 2012/0009758 A1    Jan. 12, 2012

Related U.S. Application Data

(62) Division of application No. 11/871,246, filed on Oct. 12, 2007, now Pat. No. 8,049,198.

(30) Foreign Application Priority Data

Mar. 30, 2007 (KR) .......................... 10-2007-0031879

(51) Int. Cl.
*G11C 11/00* (2006.01)

(52) U.S. Cl. ......... 365/163; 257/2; 257/5; 257/E47.001; 257/E29.002; 257/4; 365/148

(58) Field of Classification Search .................. 365/46, 365/94, 100, 113, 129, 148, 163; 257/2–5, 257/9, 296, 310, E21.35, E31.047, E27.006; 438/29, 95, 96, 166, 135, 240, 785, 259, 438/365, 482, 486, 597; 977/754
See application file for complete search history.

(56) References Cited

U.S. PATENT DOCUMENTS

| 2005/0064606 | A1* | 3/2005 | Pellizzer et al. ................... 438/3 |
| 2006/0073631 | A1* | 4/2006 | Karpov et al. ................ 438/102 |
| 2007/0097738 | A1 | 5/2007 | Asano et al. |
| 2007/0120107 | A1* | 5/2007 | Hayakawa ........................ 257/4 |
| 2007/0152205 | A1* | 7/2007 | Chen ................................. 257/4 |

FOREIGN PATENT DOCUMENTS

| KR | 1020060001055 A | 1/2006 |
| KR | 100795908 B1 | 1/2008 |

OTHER PUBLICATIONS

A. Provano, et al; "µTrench Phase-Change Memory Cell Engineering and Optimization", Proceedings of ESSDERC, Grenoble, France, Sep. 12-16, 2005, pp. 313-316.
USPTO OA mailed Jul. 16, 2009 in connection with U.S. Appl. No. 11/871,246.
USPTO OA mailed Nov. 25, 2009 in connection with U.S. Appl. No. 11/871,246.

(Continued)

*Primary Examiner* — Harry W Byrne
(74) *Attorney, Agent, or Firm* — Ladas & Parry LLP

(57) ABSTRACT

A phase change memory device for preventing thermal crosstalk includes lower electrodes respectively formed in a plurality of phase change cell regions of a semiconductor substrate. A first insulation layer is formed on the semiconductor substrate including to the lower electrodes having holes for exposing the respective lower electrodes. Heaters are formed on the surfaces of the respective holes to contact the lower electrodes. A second insulation layer is formed to fill the holes in which the heaters are formed. A mask pattern is then formed on the first and second insulation layers, including the heaters, to have openings that expose portions of the respective heaters having a constant pitch. A phase change layer is formed on the mask pattern including the exposed portions of the heaters and the first and second insulation layers and subsequently, upper electrodes are formed on the phase change layer.

8 Claims, 10 Drawing Sheets

OTHER PUBLICATIONS

USPTO OA mailed Mar. 26, 2010 in connection with U.S. Appl. No. 11/871,246.
USPTO OA mailed Sep. 7, 2020 in connection with U.S. Appl. No. 11/871,246.
USPTO OA mailed Feb. 9, 2011 in connection with U.S. Appl. No. 11/871,246.
USPTO NOA mailed Jul. 18, 2011 in connection with U.S. Appl. No. 11/871,246.

* cited by examiner

PHASE CHANGE MEMORY DEVICE TO PREVENT THERMAL CROSS-TALK AND METHOD FOR MANUFACTURING THE SAME

CROSS-REFERENCE TO RELATED APPLICATIONS

The present application claims priority to Korean patent application number 10-2007-0031879 filed on Mar. 30, 2007, which is incorporated herein by reference in its entirety.

BACKGROUND OF THE INVENTION

The present invention relates to a phase change memory device and a method for manufacturing the same, and more particularly, to a phase change memory device that can prevent thermal cross-talk due to high integration of a device.

Generally, memory devices can be classified divided into volatile RAM (random access memory), which loses inputted information when power is interrupted, and non-volatile ROM (read-only memory), which can continuously maintain the stored state of inputted information even when power is interrupted. Volatile RAM may include DRAM (dynamic RAM) and SRAM (static RAM) and non-volatile ROM may include, a flash memory such as an EEPROM (electrically erasable and programmable ROM).

It is well known that DRAM is an excellent memory device, however DRAM requires a high charge storing capacity and since the surface area of an electrode must be increased, it is difficult to accomplish a high level of integration. Further, flash memory stacks two gates on one another requiring a high operation voltage when compared to a source voltage. Accordingly, since a separate booster circuit is needed to form the necessary voltage for write and delete operations, it is difficult to obtain a high level of integration.

Research to develop a novel memory device having a simple configuration and capable of accomplishing a high level of integration while retaining the characteristics of non-volatile memory has been made. For example, a phase change memory device has recently been disclosed in the art.

In a phase change memory device, a phase change occurs in a phase change layer interposed between a lower electrode and an upper electrode. The phase change layer changes from a crystalline state to an amorphous state due to current flow between the lower electrode and the upper electrode. The information stored in a cell is determined by the medium difference in resistance between the crystalline state and the amorphous state.

In detail, in the phase change memory device a current is applied to a phase change material such as a compound made of germanium, stibium and tellurium (Ge—Sb—Te: GST) and a compound made of argentum, indium, stibium and tellurium (Ag—In—Sb—Te: AIST). The phase change material undergoes a phase change between the amorphous state and the crystalline state by heat (e.g. Joule heat). Accordingly, in the phase change memory device the specific resistance of a phase change layer in the amorphous state is higher than the specific resistance of the phase change layer in the crystalline state. In a read mode, sensing the current flowing through the phase change layer determines whether the information stored in a phase change memory cell has a logic value of '1' or '0'.

Meanwhile, in a conventional phase change memory device, as shown in FIG. 1, cylinder type heaters 140 are located in respective cells of a semiconductor substrate 100 that has a plurality of phase change cell regions. A nitride layer 160 is formed to have an opening 160h that is shared by two cylinder type heaters 140 of adjoining cell regions. The stack pattern of a phase change layer 170 and upper electrodes 180 is located on the nitride layer 160 that has the opening 160h.

However, in the conventional phase change memory device, as the size of a phase change memory device decreases, the distance between two cylinder type heaters 140 formed in the cells gradually decreases. Therefore, thermal cross-talk being an undesired phase change phenomenon occurs in an adjoining portion of the phase change layer 170 under thermal influence where Joule heat generated within the radius at the interface between the cylinder type heater 140 and the phase change layer 170 decreases.

In FIG. 1, reference numeral 110 designates an interlayer dielectric, 120 lower electrodes, and 130 and 150 insulation layers.

The thermal cross-talk is likely to change the data stored in the phase change cell or adversely influence the phase change cell thereby decreasing a sensing margin.

SUMMARY OF THE INVENTION

Embodiments of the present invention are directed to a phase change memory device that can prevent thermal cross-talk securing desired characteristics and a method for manufacturing the same.

In one embodiment, a phase change memory device comprises an interlayer dielectric formed on a semiconductor substrate and lower electrodes respectively formed within the interlayer dielectric in a plurality of phase change cell regions of a semiconductor substrate; a first insulation layer formed on the interlayer dielectric including the lower electrodes and having holes for exposing the respective lower electrodes; heaters formed on surfaces of the respective holes to be brought into contact with the lower electrodes; a second insulation layer formed to fill the holes in which the heaters are formed; a mask pattern formed on the first and second insulation layers including the heaters having openings which expose portions of the respective heaters and which have a constant pitch; a phase change layer formed on the mask pattern including the exposed portions of the heaters and the first and second insulation layers; and upper electrodes formed on the phase change layer.

The heaters are formed of any one of TiN, TiW and TiAlN.

The mask pattern is formed of a nitride layer.

The mask pattern is formed in a manner such that side portions of the first and second insulation layers including the heaters are exposed in a lateral cell arrangement direction.

The mask pattern is formed in a manner such that side to portions of the first and second insulation layers including the heaters are exposed in a direction which is perpendicular to a cell arrangement direction.

The phase change memory device further comprises spacers formed on both sidewalls of each opening of the mask pattern.

In another embodiment, a method for manufacturing a phase change memory device comprises the steps of forming an interlayer dielectric on a semiconductor substrate; etching the interlayer dielectric to form contact holes in a plurality of phase change cell regions of the semiconductor substrate; forming lower electrodes respectively in the plurality of phase change cell regions of a semiconductor substrate; forming a first insulation layer on the interlayer dielectric including the lower electrodes to have holes which expose the respective lower electrodes; forming a material layer for heaters on the first insulation layer including the holes; forming a second insulation layer on the material layer for heaters to fill the holes in which the material layer for heaters is formed; polishing chemically and mechanically the second insulation layer and the material layer for heaters to expose the first insulation layer, and thereby forming heaters on surfaces of the holes to be brought into contact with the lower electrodes; forming a mask pattern on the first and second insulation layers including the heaters to have openings which expose portions of the respective heaters and which have a constant pitch; forming a phase change layer on the mask pattern including the exposed portions of the heaters and the first and second insulation layers; and forming upper electrodes on the phase change layer.

The material layer for heaters is formed of any one of TiN, TiW and TiAlN.

The material layer for heaters is formed through chemical vapor deposition or atomic layer disposition.

The mask pattern is formed of a nitride layer.

The mask pattern is formed in a manner such that side portions of the first and second insulation layers including the heaters are exposed in a cell arrangement direction.

The mask pattern is formed in a manner such that side portions of the first and second insulation layers including the heaters are exposed in a direction which is perpendicular to a cell arrangement direction.

After the step of forming the mask pattern and before the step of forming the phase change layer, the method further comprises the step of forming spacers on both sidewalls of each opening of the mask pattern.

The upper electrodes are formed of any one of TiN, TiW and TiAlN.

DESCRIPTION OF SPECIFIC EMBODIMENTS

In the present invention, a mask pattern is formed to have openings that expose heaters brought into contact with lower electrodes. The mask pattern is formed such that the openings, that is, the exposed portions of the heaters have a constant pitch.

This will be described in detail with reference to FIG. 2, which is a plan view and a cross-sectional view illustrating a phase change memory device in accordance with an embodiment of the present invention.

Figure 1:
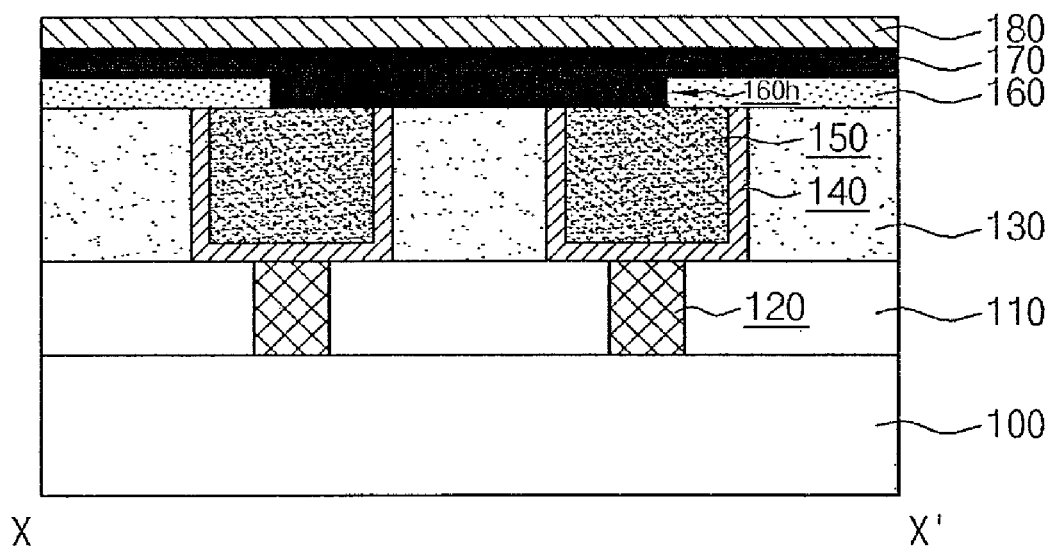
FIG. 1 is a plan view and a cross-sectional view illustrating a conventional phase change memory device.
Figure 1:
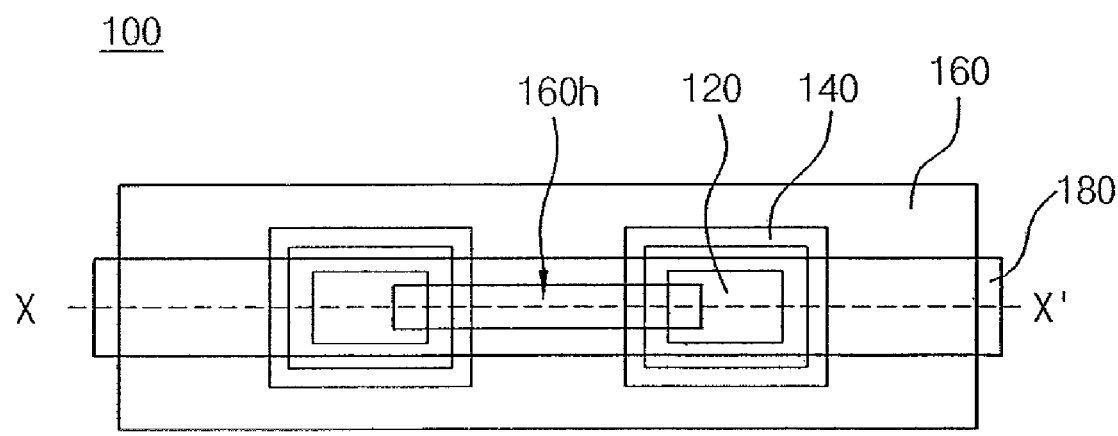
Figure 2:
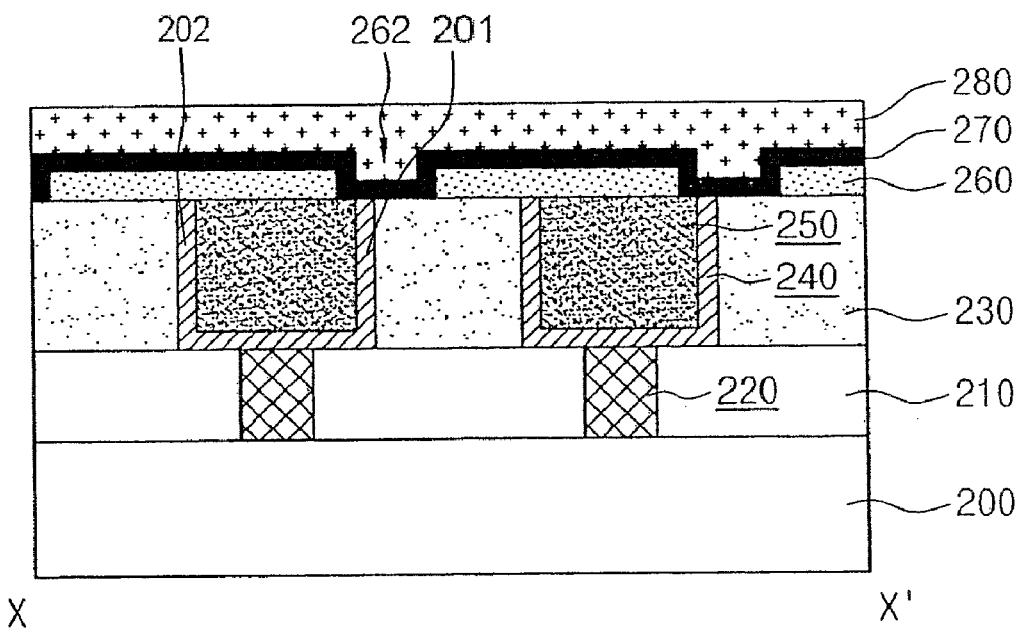
FIG. 2 is a plan view and a cross-sectional view illustrating a phase change memory device in accordance with an embodiment of the present invention.
Figure 2:
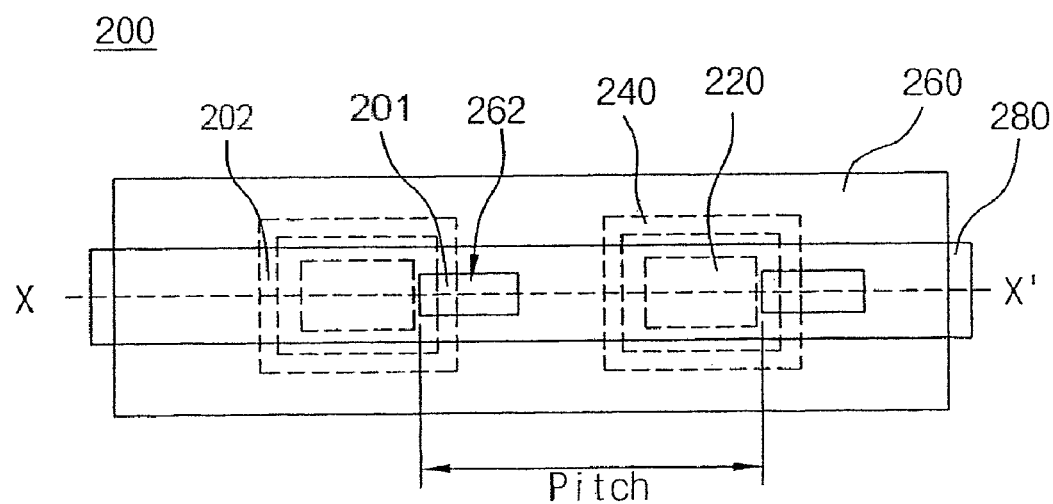

In FIG. 2, a semiconductor substrate 200 has a plurality of phase change cell regions having lower electrodes 220 formed in the respective phase change cell regions. An interlayer dielectric 210 is formed on the semiconductor substrate 200 including the lower electrodes 220. A first insulation layer 230 is formed on the interlayer dielectric 210 including the lower electrodes 220 having holes that respectively expose the lower electrodes 220. Cylinder type heaters 240 are formed on the surfaces of the holes to contact the lower electrodes 220 and a second insulation layer 250 is formed in the grooves defined in the cylinder type heaters 240.

A mask pattern 260 is formed on the first and second insulation layers 230 and 250 including the cylinder type heaters 240 having openings 262 that expose portions of the cylinder type heaters 240. In the embodiment shown in FIG. 2, the heater has a first side 201 and a second side 202 opposite the first side 201, and the openings 262 of the mask pattern 260 selectively expose center portions of the first side 201 of the respective heaters. The openings 262 of the mask pattern 260 are defined such that the exposed portions of the cylinder type heaters 240 have a constant pitch.

A phase change layer 270 and upper electrodes 280 are sequentially formed on the portions of the cylinder type heaters 240 and the first and second insulation layers 230 and 250, which are exposed through the openings 262, and on the mask pattern 260.

In the phase change memory device according to the present invention, the areas of adjoining phase change cells, in which phase change occurs, are separated by a maximum interval since the exposed portions of the cylinder type heaters 240 have a constant pitch. Accordingly, in the phase change memory device according to the present invention, because it is possible to maintain a distance that is free of thermal cross-talk between adjoining phase change cells, thermal cross-talk due to Joule heat can be effectively prevented between the adjoining phase change cells.

Hereafter, a method for manufacturing a phase change memory device in accordance with another embodiment of the present invention will be described with reference to FIGS. 3A through 3E.

Figure 3A:
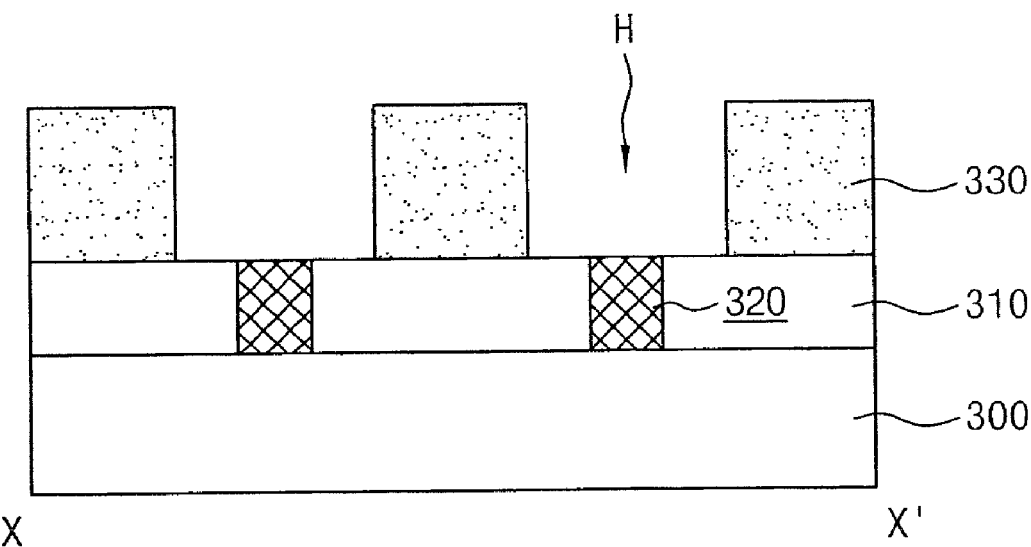
FIGS. 3A through 3E are plan views and cross-sectional views illustrating the processes of a method for manufacturing a phase change memory device in accordance with another embodiment of the present invention.
Figure 3A:
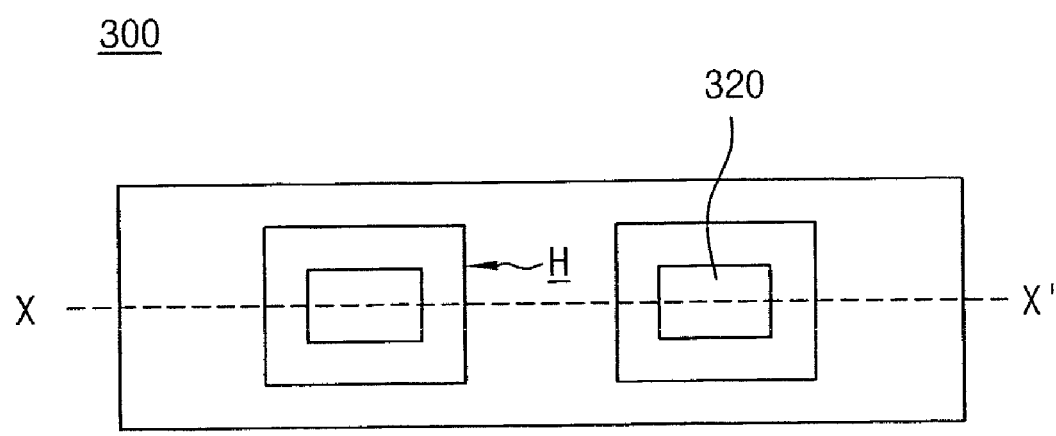

Referring to FIG. 3A, there is formed an interlayer dielectric 310 on a semiconductor substrate 300 having a plurality of phase change cell regions. By etching the interlayer dielectric 310, contact holes are defined in the respective phase change cell regions. A material layer for lower electrodes is deposited on the interlayer dielectric 310 including the contact holes. The material layer for the lower electrodes is then etched until the interlayer dielectric 310 is exposed resulting in dot type lower electrodes 320 formed in the respective phase change cell regions. A first insulation layer 330 is deposited on the interlayer dielectric 310 and the lower electrodes 320. Holes H are defined to expose the respective lower electrodes 320 within the first insulation layer 330 by conducting a masking process and an etching process.

Figure 3B:
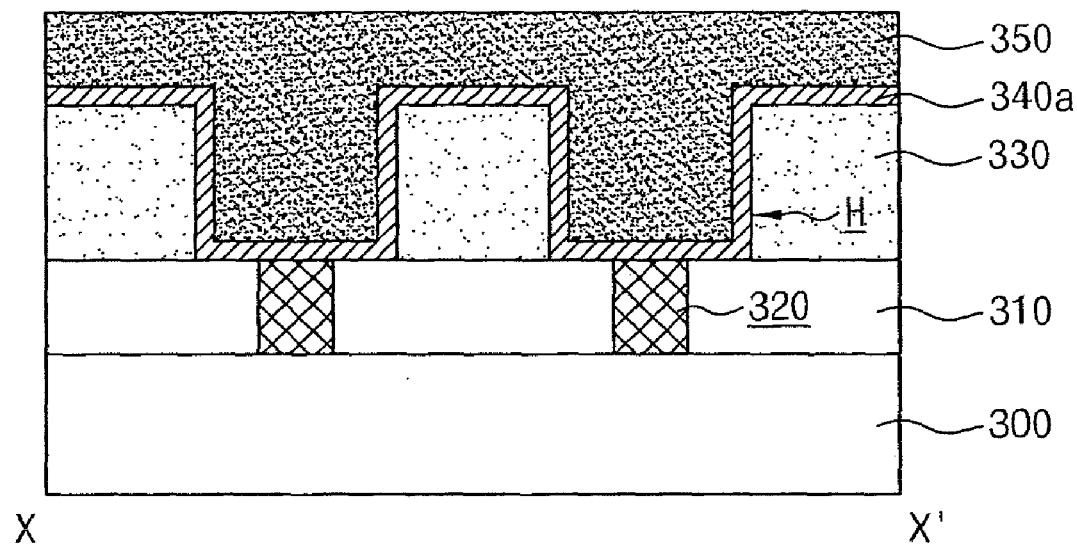
Figure 3B:
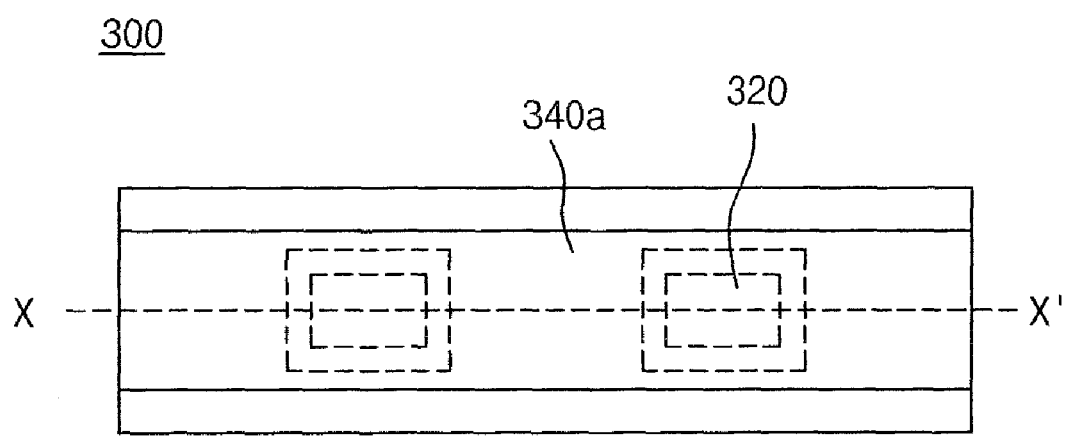

Referring to FIG. 3B, a material layer 340a for heaters is deposited to a uniform thickness on the first insulation layer 330 including the holes H. The material layer 340a for heaters is formed of a material that has low reactivity with a subsequently formed phase change material. For example, the material layer 340a for heaters is formed by chemical vapor deposition (CVD) or atomic layer deposition (ALD) using any one of TiN, TiW and TiAlN. A second insulation layer 350 is deposited on the material layer 340a for heaters to fill the holes H in which the material layer 340a for heaters is formed.

Figure 3C:
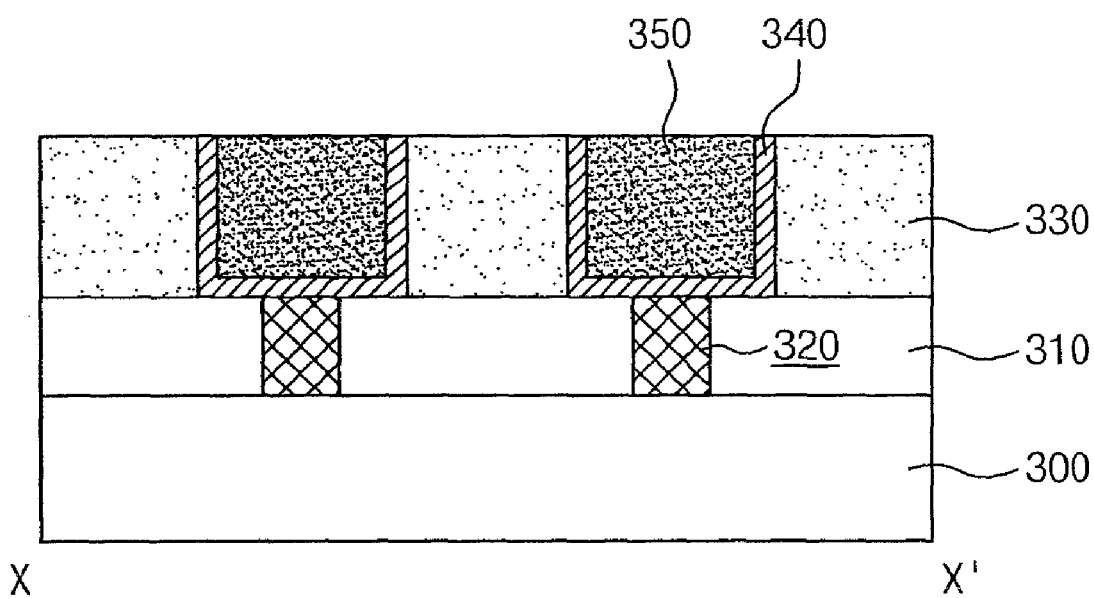
Figure 3C:
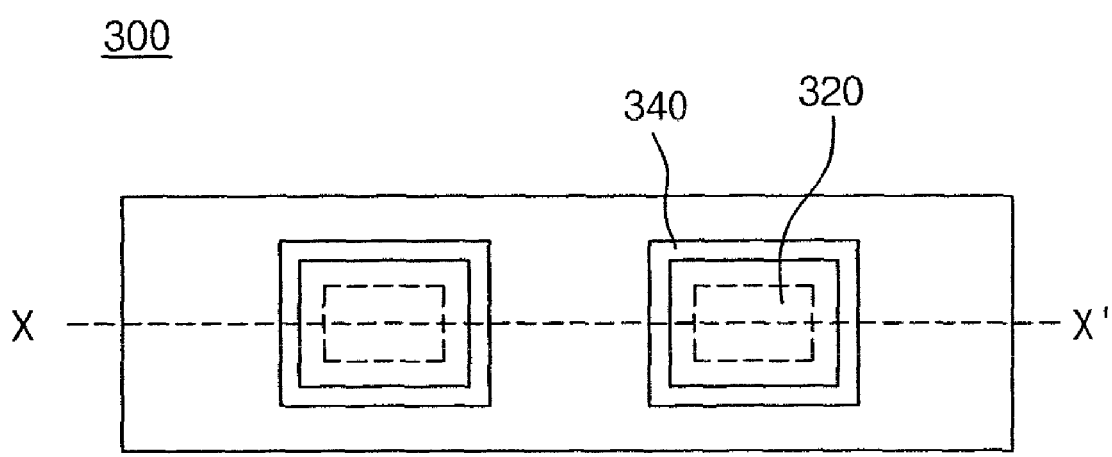

Referring to FIG. 3C, the second insulation layer 350 and the material layer 340a for heaters is polished by CMP (chemically and mechanically polishing) until the first insulation layer 330 is exposed. Thereby cylinder type heaters 340 are formed on the surfaces of the holes H and contact the lower electrodes 320.

Figure 3D:
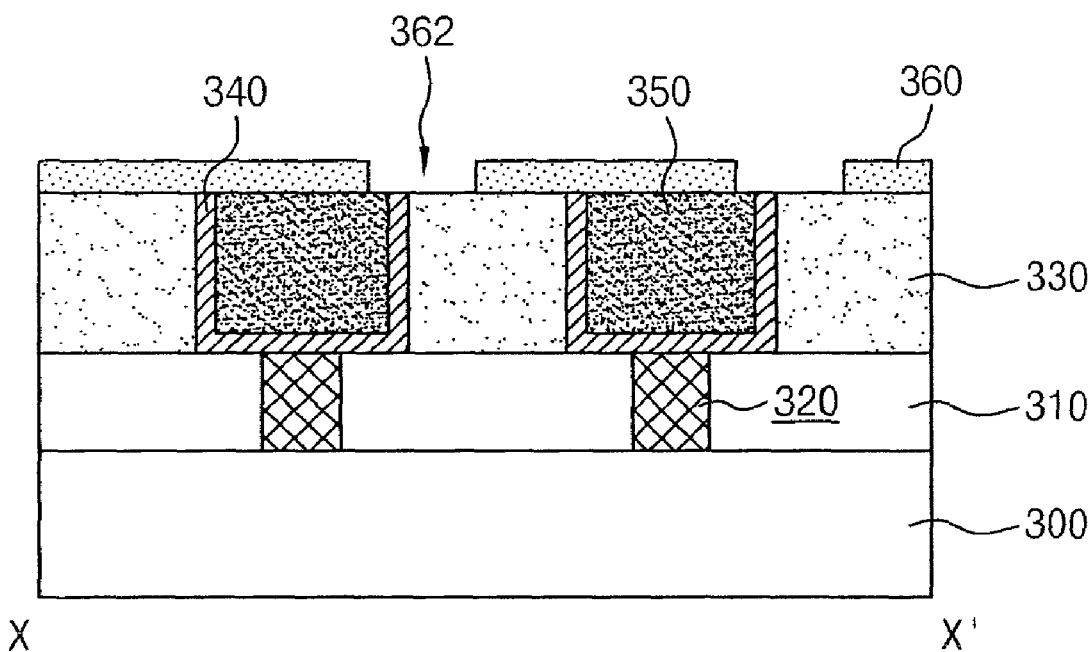
Figure 3D:
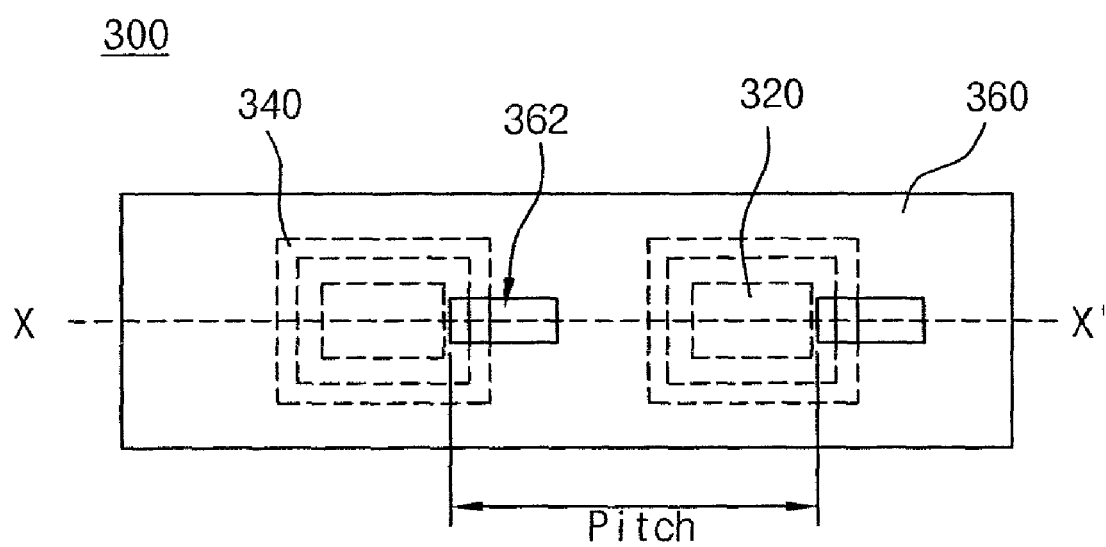

Referring to FIG. 3D, a nitride layer is deposited as a mask on the first and second insulation layers 330, 350 including the cylinder type heaters 340. The nitride layer is then etched by conducting a masking process and an etching process. A mask pattern 360, which has openings 362 for exposing portions of the respective cylinder type heaters 340, is then formed. At this time, the openings 362 are defined such that the exposed portions of the cylinder type heaters 340 have a constant pitch. The openings 362 of the mask pattern 360 are defined such that the side portions of the first and second insulation layers 330, 350 including the cylinder type heaters 340 are exposed in a direction in which the cells are arranged, while having a constant pitch.

Figure 3E:
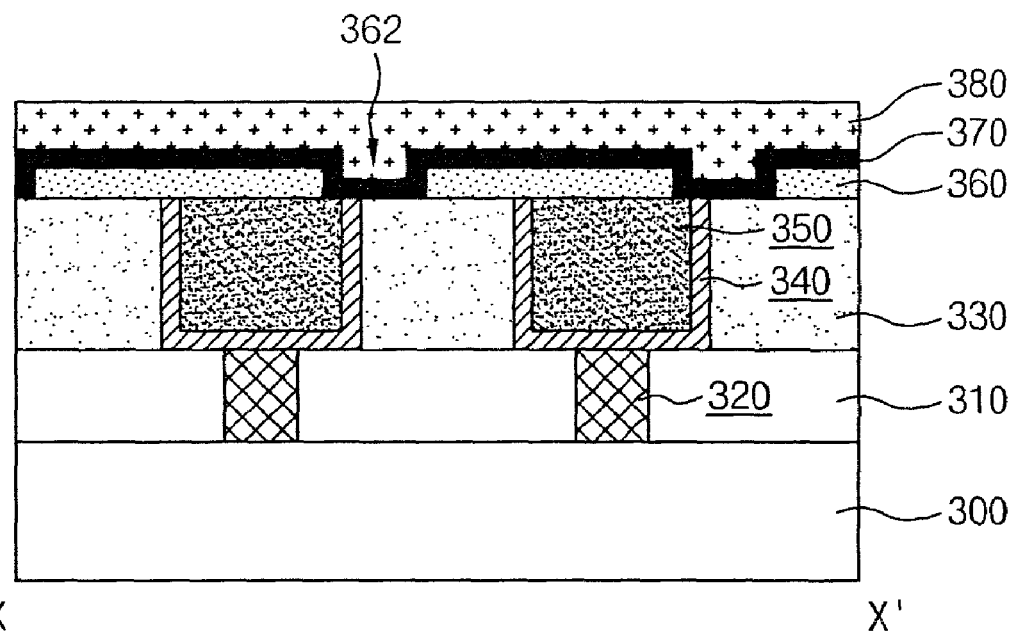
Figure 3E:
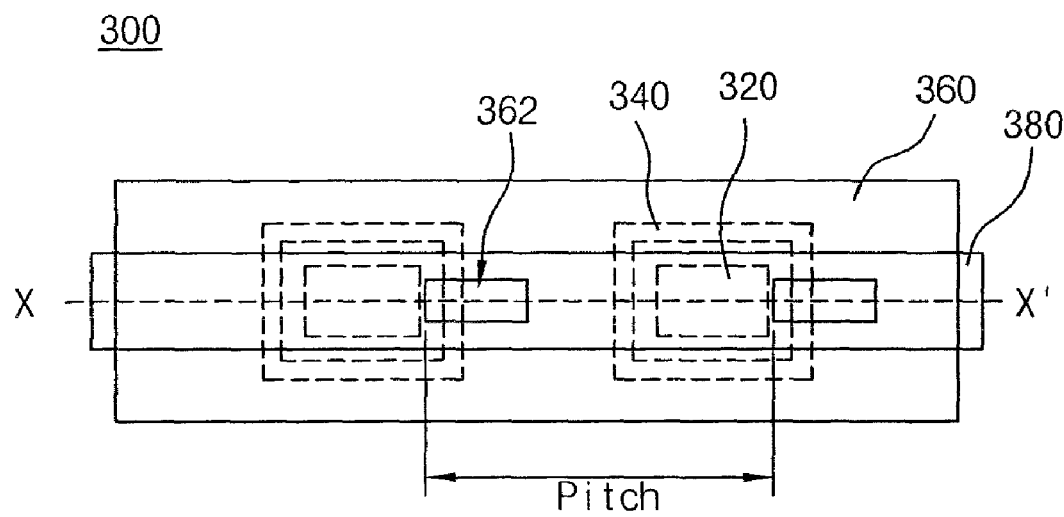

Referring to FIG. 3E, a phase change material layer and a material layer for upper electrodes are sequentially deposited on the mask pattern 360 including the respective cylinder type heaters 340. A stack pattern of a phase change layer 370 and upper electrodes 380 is formed on the mask pattern 360 including the exposed portions of the cylinder type heaters 340 and the first and second insulation layers 330, 350 by etching the material layer for upper electrodes and the phase change material layer.

The phase change memory device according to the present invention is completed by sequentially conducting a series of subsequent well-known processes, not shown, including a process for forming bit lines to contact the upper electrodes 380.

As described above in the present invention, because the nitride layer mask pattern 360 is formed to expose the portions of the cylinder type heaters 340 having a constant pitch, the exposed portions of the cylinder type heaters 340 can be separated by a maximum interval. Therefore, in the present invention, because it is possible to maintain a distance free of thermal cross-talk between adjoining phase change cells, the thermal cross-talk due to Joule heat between the adjoining phase change cells is prevented.

Figure 4A:
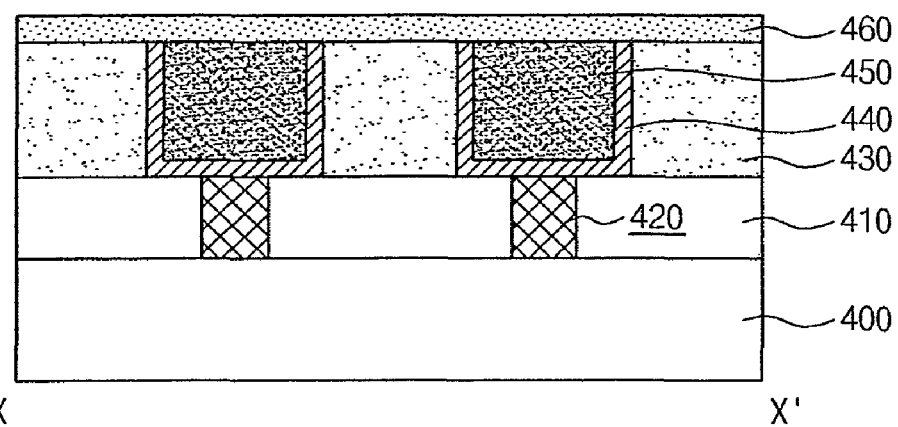
FIGS. 4A and 4B are plan views and cross-sectional views illustrating the processes of a method for manufacturing a phase change memory device in accordance with still another embodiment of the present invention.
Figure 4A:
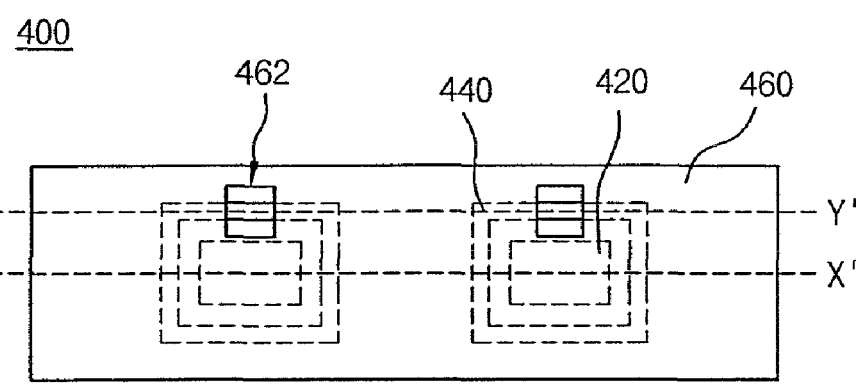
Figure 4A:
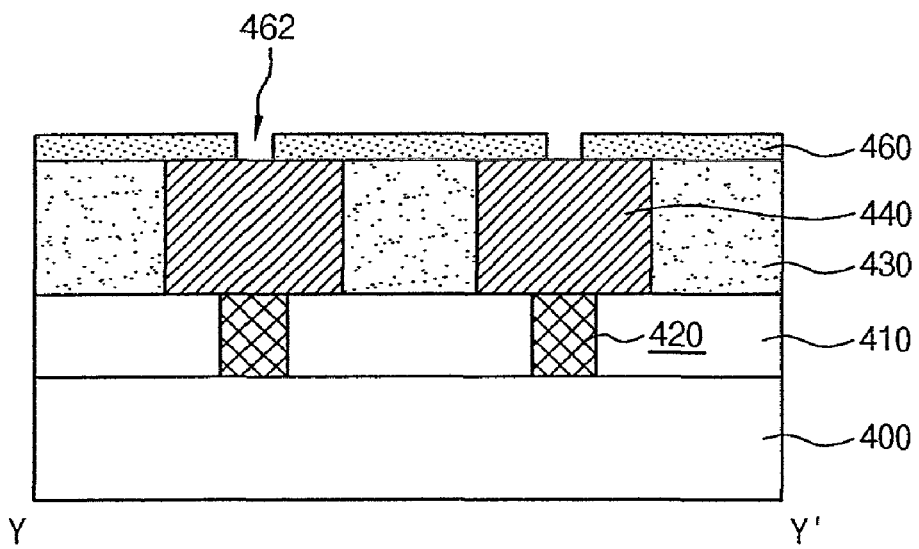
Figure 4B:
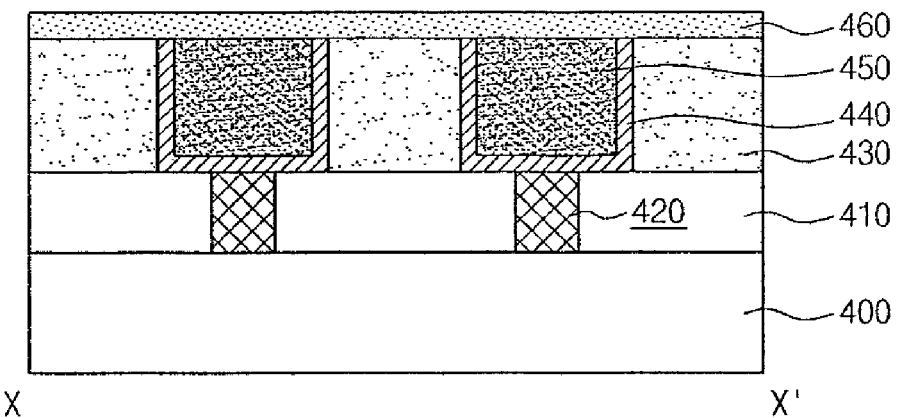
Figure 4B:
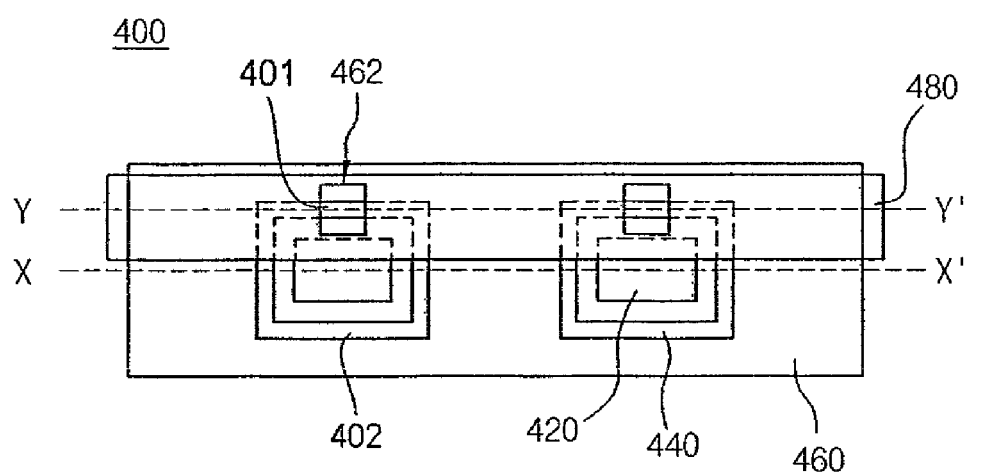
Figure 4B:
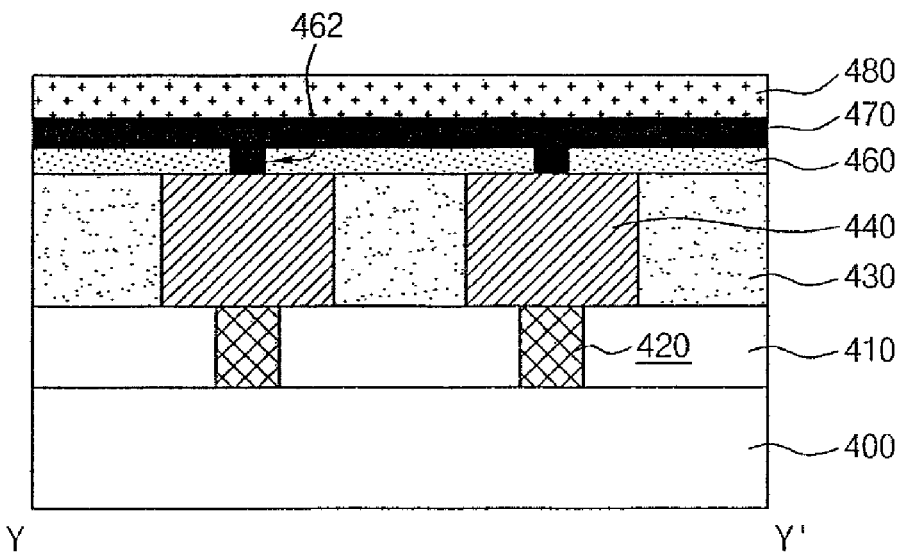

FIGS. 4A and 4B are plan views and cross-sectional views illustrating the processes of a method for manufacturing a phase change memory device in accordance with still another embodiment of the present invention.

Referring to FIGS. 4A and 4B, a mask pattern 460 is formed to have openings 462 such that the side portions of first and second insulation layers 430, 450 including portions of the cylinder type heaters 440 are exposed in a pitch. In the embodiment shown in FIGS. 4A and 4B, the heater has a first side 401 and a second side 402 opposite the first side 401, and the openings 462, of the mask pattern 460 selectively expose center portions of the first side 401 of the respective heaters. Further, the stack pattern of a phase change layer 470 and upper electrodes 480 is formed on the mask pattern 460 that exposes the portions of the cylinder type heaters 440 and first and second insulation layers 430, 450 in the direction perpendicular to the cell arrangement direction.

In the phase change memory device according to the present embodiment, although not described in detail, the exposed portions of the cylinder type heaters 440 between adjoining phase change cells can be separated by a maximum interval. Therefore, similar to that of the aforementioned embodiment, it is possible to prevent thermal cross-talk between the adjoining phase change cells.

In FIGS. 4A and 4B, unexplained reference numeral 400 designates a semiconductor substrate, 410 an interlayer dielectric, and 420 lower electrodes.

Figure 5:
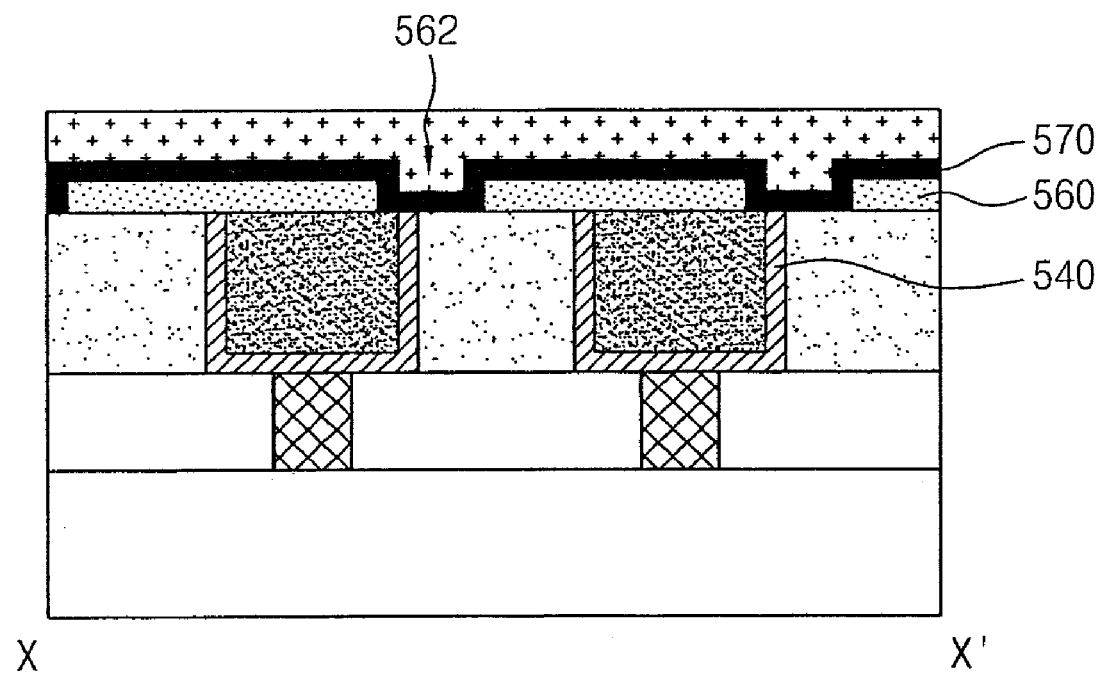
FIG. 5 is a plan view and a cross-sectional view illustrating a phase change memory device in accordance with a still further embodiment of the present invention.
Figure 5:
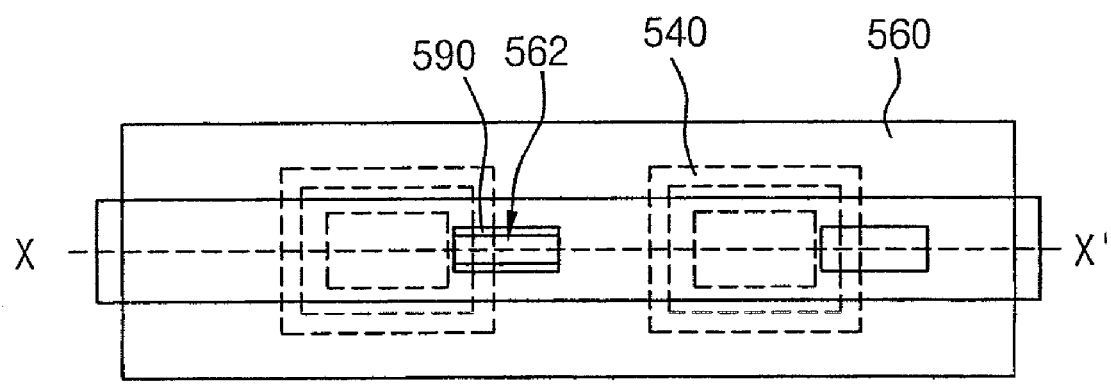

FIG. 5 is a plan view and a cross-sectional view illustrating a phase change memory device in accordance with still another embodiment of the present invention.

Referring to FIG. 5, in a phase change memory device according to the present embodiment, spacers 590 are formed on both sidewalls of each opening 562 of a mask pattern 560. The spacers 590 decrease the amount of cylinder type heaters 540 that is exposed by the openings 562 of the mask pattern 560. The contact area between the cylinder type heater 540 and a phase change layer 570 can be decreased as a result. Therefore, a current required for the phase change of the phase change layer 570 can be reduced and the driving characteristics of the phase change memory device according to the present embodiment can be improved.

Conducting the remaining processes as the aforementioned embodiments excluding the process for forming the spacers completes the manufacture of the phase change memory device according to the present embodiment.

As is apparent from the above description in the present invention, a mask pattern is formed to expose portions of cylinder type heaters such that the exposed portions of the cylinder type heaters have a constant pitch. It is therefore possible to maintain a distance free of thermal cross-talk between adjoining phase change cells. Therefore, the thermal cross-talk due to Joule heat between the adjoining phase change cells can be effectively prevented.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a phase change memory device, comprising the steps of:
    forming an interlayer dielectric on a semiconductor substrate;
    etching the interlayer dielectric to form contact holes in a plurality of phase change cell regions of the semiconductor substrate;
    forming lower electrodes respectively in the plurality of phase change cell regions of the semiconductor substrate;
    forming a first insulation layer on the interlayer dielectric including the lower electrodes to have holes which expose the respective lower electrodes;
    forming a material layer for heaters on the first insulation layer including the holes;
    forming a second insulation layer on the material layer for heaters to fill the holes in which the material layer for heaters is formed;
    polishing chemically and mechanically the second insulation layer and the material layer for heaters to expose the first insulation layer, and thereby forming heaters on surfaces of the holes to be brought into contact with the lower electrodes;
    forming a mask pattern on the first and second insulation layers including the heaters to have openings which expose portions of the respective heaters and which have a constant pitch, wherein the openings are arranged to expose the heaters in a direction perpendicular to the cell arrangement direction;
    forming a phase change layer on the mask pattern including the exposed portions of the heaters and the first and second insulation layers; and
    forming upper electrodes on the phase change layer.

2. The method according to claim 1, wherein the material layer for heaters is formed of any one of TiN, TiW and TiAlN.

3. The method according to claim 1, wherein the material layer for heaters is formed through chemical vapor deposition or atomic layer deposition.

4. The method according to claim 1, wherein the mask pattern is formed of a nitride layer.

5. The method according to claim 1, wherein the mask pattern is formed in a manner such that side portions of the first and second insulation layers including the heaters are exposed in a lateral cell arrangement direction.

6. The method according to claim 1, wherein the mask pattern is formed in a manner such that side portions of the first and second insulation layers including the heaters are exposed in a direction which is perpendicular to a cell arrangement direction.

7. The method according to claim 1, wherein, after the step of forming the mask pattern and before the step of forming the phase change layer, the method further comprises the step of:

forming spacers on both sidewalk of each opening of the mask pattern.

8. The method according to claim 1, wherein the upper electrodes are formed of any one of TiN, TiW and TiAlN.

* * * * *